US007839175B2

United States Patent
Franch

(10) Patent No.: US 7,839,175 B2
(45) Date of Patent: *Nov. 23, 2010

(54) LOCAL CLOCK BUFFER (LCB) WITH ASYMMETRIC INDUCTIVE PEAKING

(75) Inventor: Robert L. Franch, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/185,358

(22) Filed: Aug. 4, 2008

(65) Prior Publication Data

US 2008/0290893 A1    Nov. 27, 2008

Related U.S. Application Data

(63) Continuation of application No. 11/695,190, filed on Apr. 2, 2007, now Pat. No. 7,459,940.

(51) Int. Cl.
    *H03K 19/096* (2006.01)
(52) U.S. Cl. ....................................................... 326/97
(58) Field of Classification Search ................... 326/93, 326/95, 82–87; 327/108–109
    See application file for complete search history.

(56) References Cited

U.S. PATENT DOCUMENTS 7,136,622 B2 * 11/2006 Rofougaran et al. .......... 455/20
2005/0104646 A1    5/2005 Restle

OTHER PUBLICATIONS

Author: Yamazaki et al, Title: a 25GHz Clock Buffer and a 50Gb/s 2:1 Selector in 90nm CMOS, Date: Jun. 2004, Publisher: IEEE International Solid State Circuit Conference, Pertinent pages: all pages including drawings.*
Author: Daisuke Yamazaki et al; Title: A 25GHz Clock Buffer and a 50Gb/s 2:1 Selector in 90nm CMOS; Date: Jun. 2004; Publisher: IEEE.*
Yamazaki et al, "A 25 GHz clock buffer and a 50 Gb/s 2:1 selector in 90 nm CMOS," IEEE ISSCC Dig. Tech. Papers, pp. 240-241, Feb. 2004Yamazaki et al, "A 25 GHz clock buffer and a 50 Gb/s 2:1 selector in 90 nm CMOS," IEEE ISSCC Dig. Tech. Papers, pp. 240-241, Feb. 2004.

* cited by examiner

*Primary Examiner*—Rexford N Barnie
*Assistant Examiner*—Thienvu V Tran
(74) *Attorney, Agent, or Firm*—Law Office of Charles W. Peterson, Jr.; Brian P. Verminski, Esq.

(57) ABSTRACT

A Local Clock Buffer (LCB), an IC chip including registers, some of which may include master/slave latches, locally clocked by the LCB, e.g., providing a launch clock and a capture clock each with an identified critical edge. The LCB includes asymmetrically inductively peaked series connected logic gates (e.g., inverters and/or NAND gates), each with an inductor between gate devices and supply ($V_{dd}$) or ground. The series connected gates alternate between having the inductor located between gate devices and the supply and located between gate devices and ground, providing asymmetric inductive peaking to maintain the sharpness of the critical edges. Optionally, corresponding logic gates in multiple LCBs may share the same inductor. Asymmetric inductive peaking allows reducing LCB power without degrading performance.

4 Claims, 5 Drawing Sheets

LOCAL CLOCK BUFFER (LCB) WITH ASYMMETRIC INDUCTIVE PEAKING

CROSS REFERENCE TO RELATED APPLICATIONS

The present application is a continuation of allowed U.S. patent application Ser. No. 11/695,190, entitled "LOCAL CLOCK BUFFER (LCB) WITH ASYMMETRIC INDUCTIVE PEAKING" to Robert L. Franch, filed Apr. 2, 2007, which is assigned to the assignee of the present invention and incorporated herein by reference.

BACKGROUND OF THE INVENTION

1. Field of the Invention

The present invention is related to integrated circuit (IC) clock systems and more particularly to optimizing power consumption in synchronous ICs.

2. Background Description

Semiconductor technology and chip manufacturing advances have resulted in a steady increase of on-chip clock frequencies, the number of transistors on a single chip and the die size itself. These increases have been accompanied by a corresponding decrease in chip supply voltage. Generally, the power consumed by a given clocked unit (e.g., latch, register, register file, functional unit and etc.) or clock driver increases linearly with the frequency of switching within the unit. Thus, not withstanding the decrease of chip supply voltage, chip power consumption has increased as well. Chip and system level cooling and packaging costs have escalated as a natural result of this increase in chip power. It is especially crucial for low end systems (e.g., handhelds, portable and mobile systems) to reduce net energy consumption to extend battery life. However, it is equally crucial that this be done without degrading performance to unacceptable levels.

A basic high performance synchronous IC chip design, e.g., a state of the art microprocessor, includes multiple register stages interspersed throughout chip logic in what is commonly referred to as a pipeline. Typically each register stage or pipeline stage includes a number of latches that are clocked together with the stage latches operating in parallel. Frequently, these pipeline latches are master and slave latches that are referred to as master/slave latches, but that are really separately clocked in latch stages within the pipeline stage. Typically a pair of local clocks, a capture and a launch clock, derived from a global clock, separately gate or clock the master and slave latches, respectively.

A first-in first-out (FIFO) register is a simple example of a pipeline. A FIFO is an M stage by N bit register file with each of M stages including an N latch register, at least one latch for each data bit. Normally, all of the stages are simultaneously clocked by a single global clock, passing data items from one stage to the next with each clock cycle or clock edge. On each clock cycle (e.g., every other rising or falling clock edge) each N-bit word in the FIFO advances one stage. An N-bit data item from an input environment (e.g., random logic connected together in some higher order logic function) enters a first stage on one clock cycle and, substantially the same N-bit word exits the last stage unchanged at an output environment (e.g., a local memory macro or some other higher order logic function) M clock cycles later. In a more complicated pipeline example, logic may separate some or all of the stages, e.g., in a state of the art pipeline microprocessors functional unit. For example, a Multiply/Add-Accumulate (MAAC) unit, where partial results (e.g., from a previous add) are rotated back from the accumulator to be added again.

In current microprocessor designs, over 70% of the power consumed is attributable to the clock alone. In a typical synchronous design, over 90% of this power is consumed in local clock splitters/drivers or buffers (LCBs) and latches. Consequently, reducing LCB power, a primary contributor to chip power consumption, significantly reduces total chip power.

A prior approach to reducing has been to de-tune the LCBs to reduce drive current at the expense of slower local clock edge rates. However, detuning also causes shallower, less well defined clock edges that result in greater timing uncertainty due to the slower edges. If the de-tuning is very aggressive, the slower clock edges ripple through subsequently clocked circuits and offsets some of the power reduction because the clock edges are in between up and down levels for larger periods. With the clock between levels, subsequently clocked gates experience more "flush current," e.g., both devices on in a CMOS inverter. So, where these shallower clock edges are unacceptable (primarily from less current driving a capacitor load and secondarily from driving the LCBs with shallower edges which also contributes to greater timing uncertainty than faster edges), reduced drive current is not a viable solution.

Thus, there exists a need to reduce power consumption in chip registers and LCBs and especially in synchronous chip registers and LCBs.

SUMMARY OF THE INVENTION

It is a purpose of the invention to reduce IC chip power;

It is another purpose of the invention to reduce synchronous IC chip power without degrading chip performance;

It is yet another purpose of the invention to reduce synchronous IC chip power consumed in CMOS clock buffers without degrading chip performance.

The present invention relates to a Local Clock Buffer (LCB), an IC chip including registers, some of which may include master/slave latches, locally clocked by the LCB, e.g., providing a launch clock and a capture clock each with an identified critical edge. The LCB includes asymmetrically inductively peaked series connected logic gates (e.g., inverters and/or NAND gates), each with an inductor between gate devices and supply ($V_{dd}$) or ground. The series connected gates alternate between having the inductor located between gate devices and the supply and located between gate devices and ground, providing asymmetric inductive peaking to maintain the sharpness of the critical edges. Optionally, corresponding logic gates in multiple LCBs may share the same inductor. Asymmetric inductive peaking allows reducing LCB power without degrading performance.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
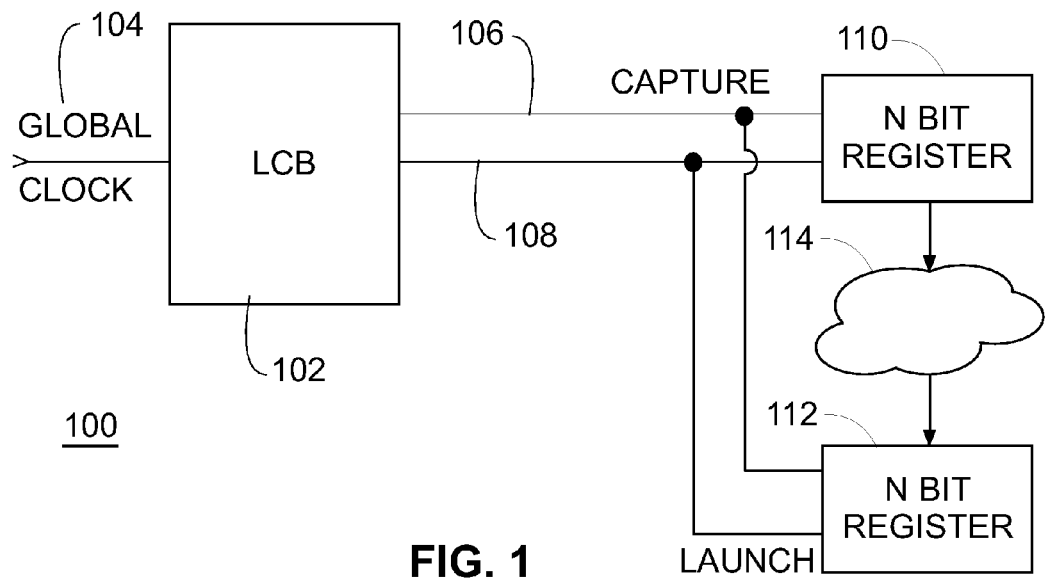
FIG. 1 shows a block diagram of an example of clocked pipeline logic, clocked by a local clock block (LCB) or clock buffer, asymmetrically inductively peaked according to a preferred embodiment of the present invention.

Turning now to the drawings and, more particularly, FIG. 1 shows a block diagram of an example of clocked pipeline logic 100, clocked by a local clock block (LCB) or clock buffer 102, asymmetrically inductively peaked according to a preferred embodiment of the present invention. A preferred LCB 102 receives and re-drives a global chip clock 104 into 2 complementary local clocks, a capture clock 106 and a launch clock 108. Both clocks 106, 108 clock N bit registers 110, 112 on either end of logic 114, e.g., an N-bit data path. In this example, the registers 110, 112 are master/slave registers with logic results being latched in the master latches (not shown) by the launch clock and passed (e.g., from stage 110) through logic (e.g., 114) to the next register stage, 112 in this example. It should be noted that although this example shows a single LCB 102 driving both registers 110, 112, typically, an LCB 102 is provided for each register or a sub-portion thereof. Thus, a typical Integrated Circuit (IC) chip may have several hundreds or even several thousand such LCBs 102. Further, although described herein for the complementary inverted gate FET technology commonly referred to as CMOS, this is for example only and not intended as a limitation.

The critical timing edges are: the fall time for the capture clock 106 and the rise time for the launch clock 108. Inductive peaking, which is a well-known in the art for sharpening gate output edges, is asymmetrically used in the LCBs 102 in combination with reducing driver sizes for reduced power. For an example of inductive peaking, see, e.g., Yamazaki et al, "A 25 GHz clock buffer and a 50 Gb/s 2:1 selector in 90 nm CMOS," *IEEE ISSCC Dig. Tech. Papers*, pp. 240-241, February 2004. So, according to a preferred embodiment of the present invention, peaking inductors (preferably, 200 pico-Henry (pH) to 700 pH) are asymmetrically placed in a detuned LCB to shape only critical edges in a preferred peaking buffer 102. By this asymmetric placement, the inductors consume less chip area and LCB 102 power may be reduced while critical edge sharpness is maintained.

Figure 2:
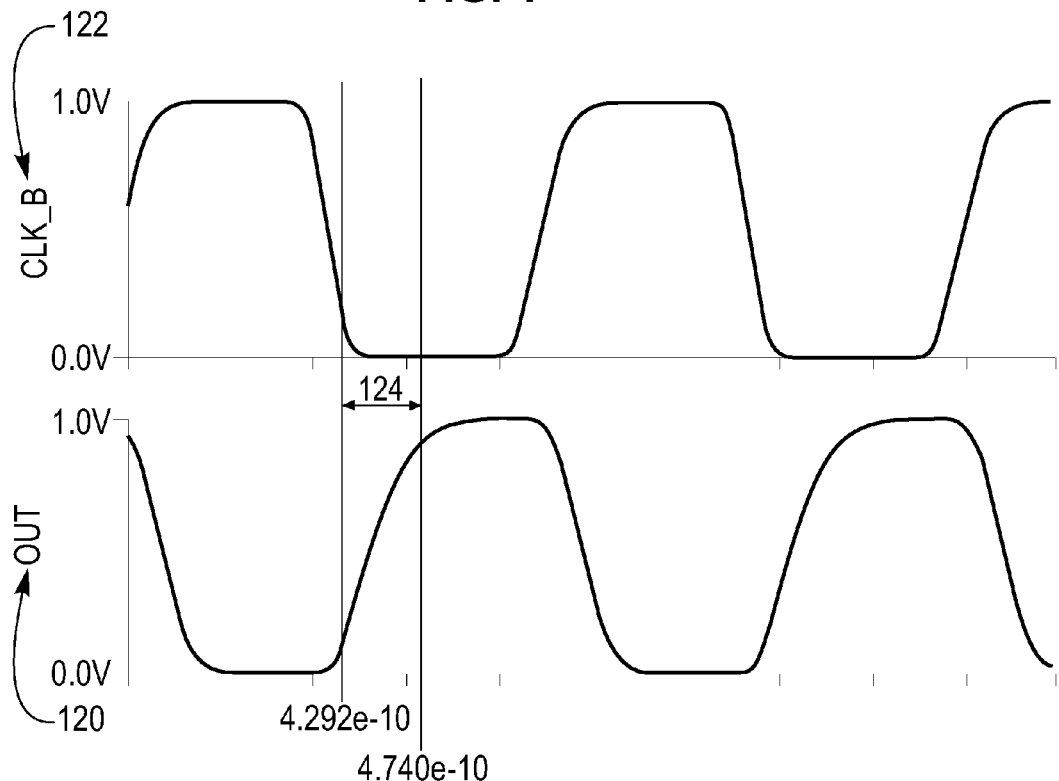
FIG. 2 shows a base-line, prior art timing example (V vs T) of a launch clock and an intermediate clock.

FIG. 2 shows a base-line, prior art timing example (V vs T) of a launch clock 120 and an intermediate clock 122, i.e., between a pair of series connected inverters driven by the global clock and driving the launch clock 120. In this example, the launch clock 120 has a 45 picoseconds (45 ps) rise time 124 at 4 GigaHertz (4 GHz). Reducing the relevant P-type Field Effect Transistor (PFET) width by 20% (i.e., the PFET driving 120), for a 3-5% reduction in overall LCB power, causes the launch clock 120 to degrade to 54 ps, i.e., 20%. This degradation is, primarily, a delay adder and secondarily further degrades subsequent signals, e.g., register outputs and subsequent logic in the data path. The present invention mitigates this degradation with asymmetric inductive peaking in the LCB circuits. Asymmetric inductive peaking re-sharpens critical edges FROM FETs with reduced device widths, minimizing the loss of local clock edge rates.

Figure 3:
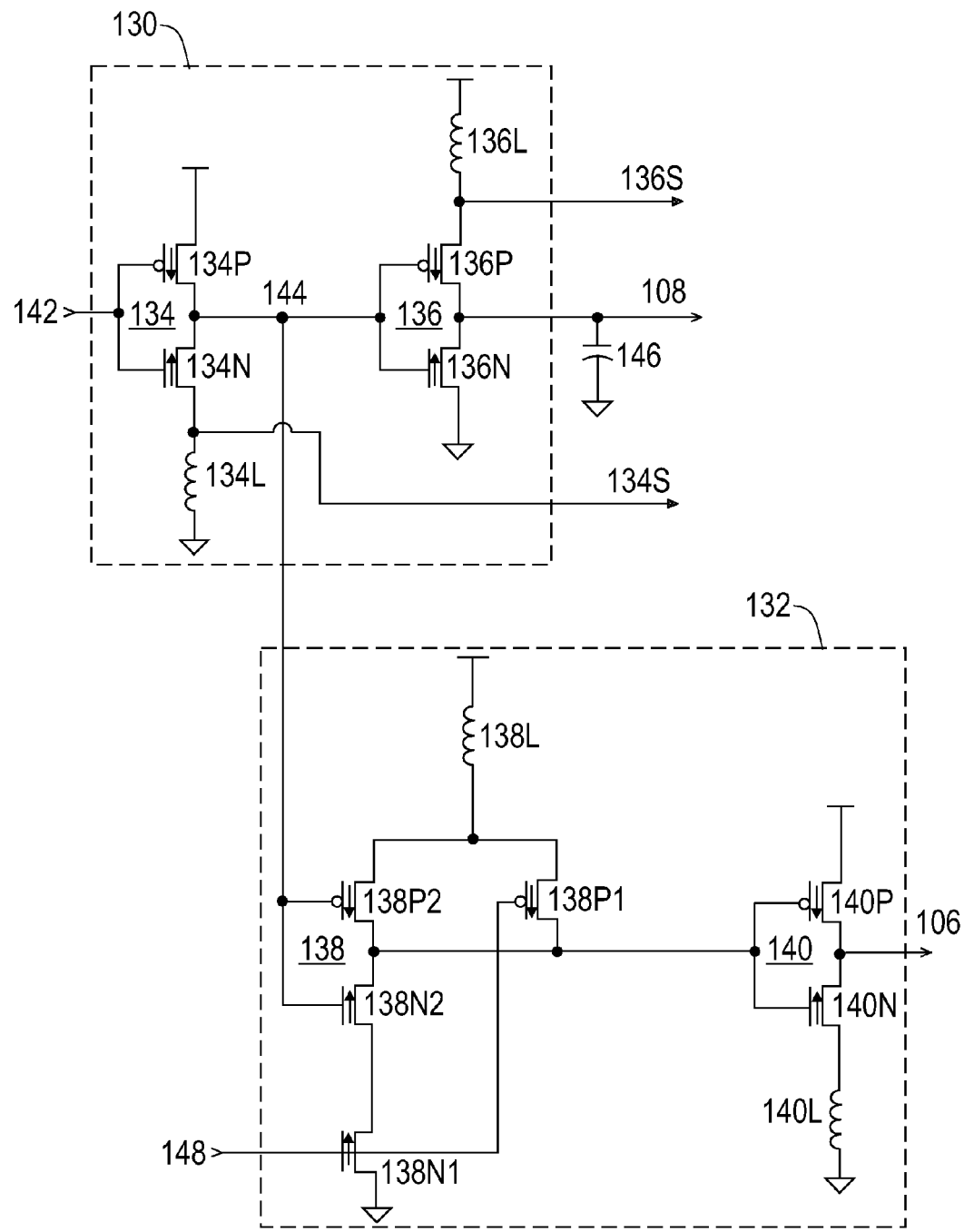
FIG. 3 shows an example of a preferred LCB in more detail.

FIG. 3 shows an example of the output stages of a preferred LCB, e.g., 102 of FIG. 1, in more detail with like elements labeled identically. In this example, the LCB 102 includes a launch clock driver 130 and a capture clock driver 132, each including series connected logic gates 134, 136 and 138, 140.

The launch clock driver 130 includes a pair of series connected inverters 134, 136 and the capture driver 132 includes a NAND gate 138 driving an inverter driver 140. The launch clock driver 130 is externally driven 142, e.g., by clock select logic or the global clock. Each inverter 134, 136 and 140 includes a PFET and an N-type FET (NFET), 134P, 134N, 136P, 136N and 140P, 140N, respectively. NAND gate 138 includes a pair of series connected NFETs 138N1, 138N2 connected between ground and an output to a pair of parallel connected PFETs, 138P1, 138P2. The inverter 134 output 144 of launch clock driver 130 is the input to the other inverter 136 and an input to NAND gate 138. Typically, inverters 136 and 140 are sized to drive a much larger load 146 than the other inverter 134 and NAND gate 138. The load 146 may include, for example, wiring to, and the clock input of, N register latches and is represented by a capacitor 146. Also in this example, the other input to NAND gate 138 is a select or gate control signal 148.

According to a preferred embodiment of the present invention each LCB gate 134, 136, 138, 140 includes a single inductor 134L, 136L, 138L, 140L. So, instead of including inductors between the supply and supply return for each gate, inductors 134L, 136L, 138L, 140L are placed to minimize the critical edge transition. In this particular example, inductors 134L, 140L are between the source of the respective NFET 138N, 140N and ground with the source of the respective PFET 138P, 140P directly connected to the supply, i.e., $V_{dd}$; inductors 136L, 138L are between the source of the respective PFET 136P, 138P and $V_{dd}$ with the source of the respective NFETs 136N, 138N directly connected to ground. Source taps 134S and 136S are provided for sharing inductances with other launch clock drivers 130.

Thus, by asymmetrically including inductors 134L, 136L, inductive peaking is provided for the rise of the non-inverting launch clock driver 130, the critical edge, independent of the non-critical falling edge. Similarly, by asymmetrically including only inductors 134L, 138L, 140L, inductive peaking is provided for the fall of the inverting capture clock driver 132, the critical edge, independent of the non-critical rising edge. Further, devices in driver 130, 132 and in particular, devices in drive inverters 136, 140 may be reduced to reduce overall chip power dissipation with the asymmetric inductive peaking compensating for reduced drive and maintaining chip performance.

Figure 4A:
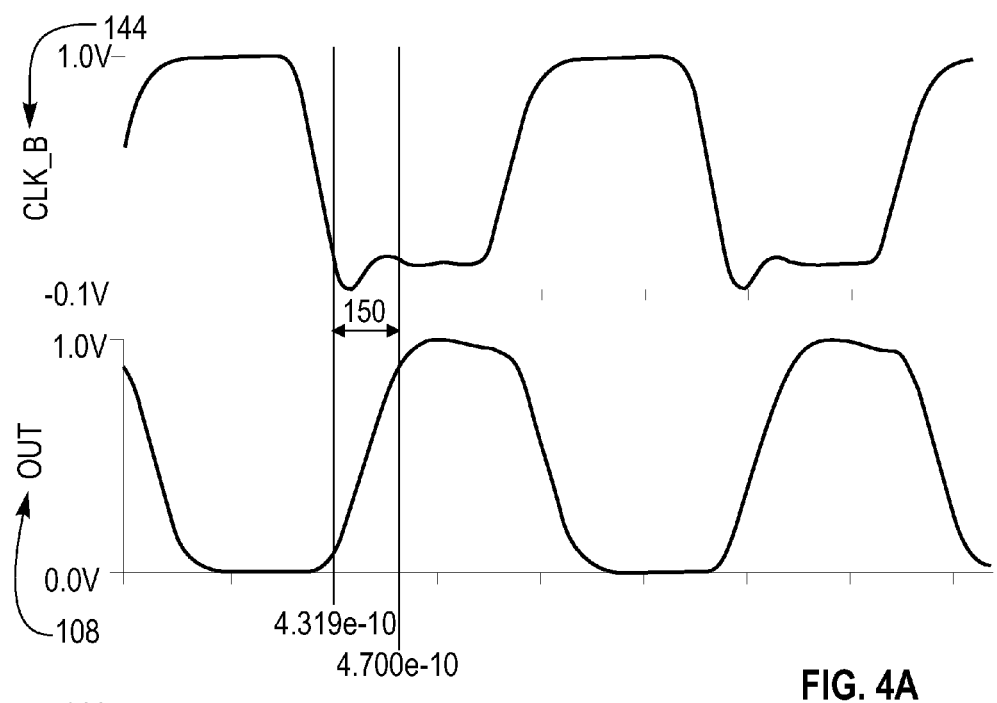
FIGS. 4A-B show timing examples of the launch clock generated by the preferred LCB both with and without power reduction.
Figure 4B:
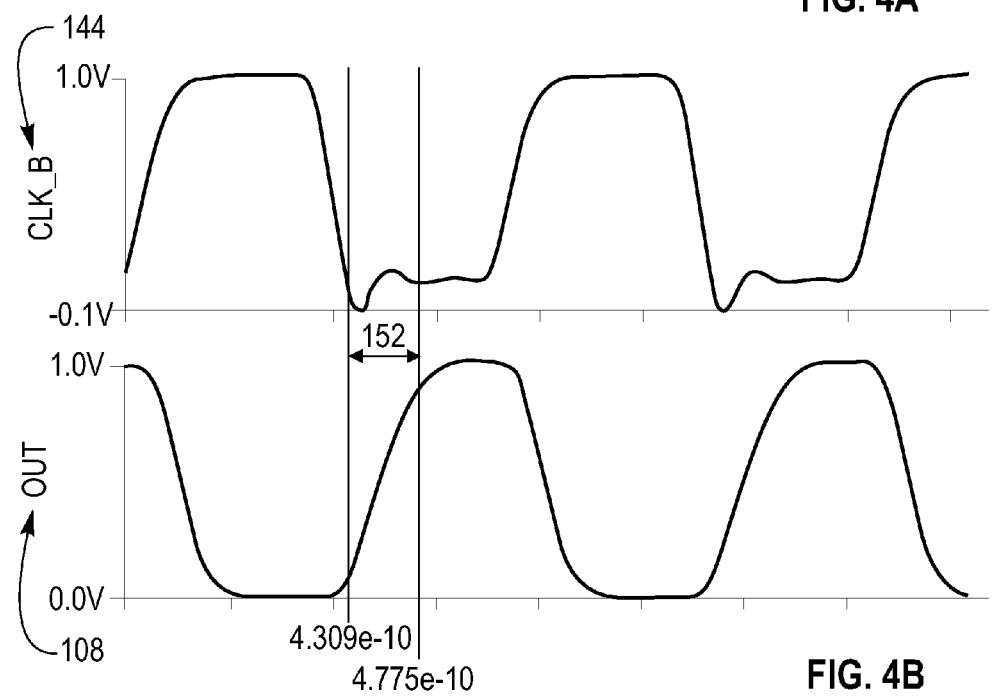

FIGS. 4A-B show timing examples of launch clock driver 130 results for the launch clock 108, (e.g., generated by the preferred LCB 102 of FIG. 1), and intermediate output 144, both with and without power reduction, i.e., with narrower devices. So, for the example of FIG. 4A, with 1 nanoHenry (1 nH) inductors selectively included in the driver 130 (otherwise substantially the same as for FIG. 2), the preferred launch clock 108 has a 38 ps rise time 150, 16% faster than FIG. 2. Moreover, by reducing the device widths by 20% to arrive at a LCB power reduction of approximately 3-5%, as can be seen from FIG. 4B, the preferred launch clock 108 has a 46 ps rise time 152, virtually the same as in FIG. 2.

Figure 5:
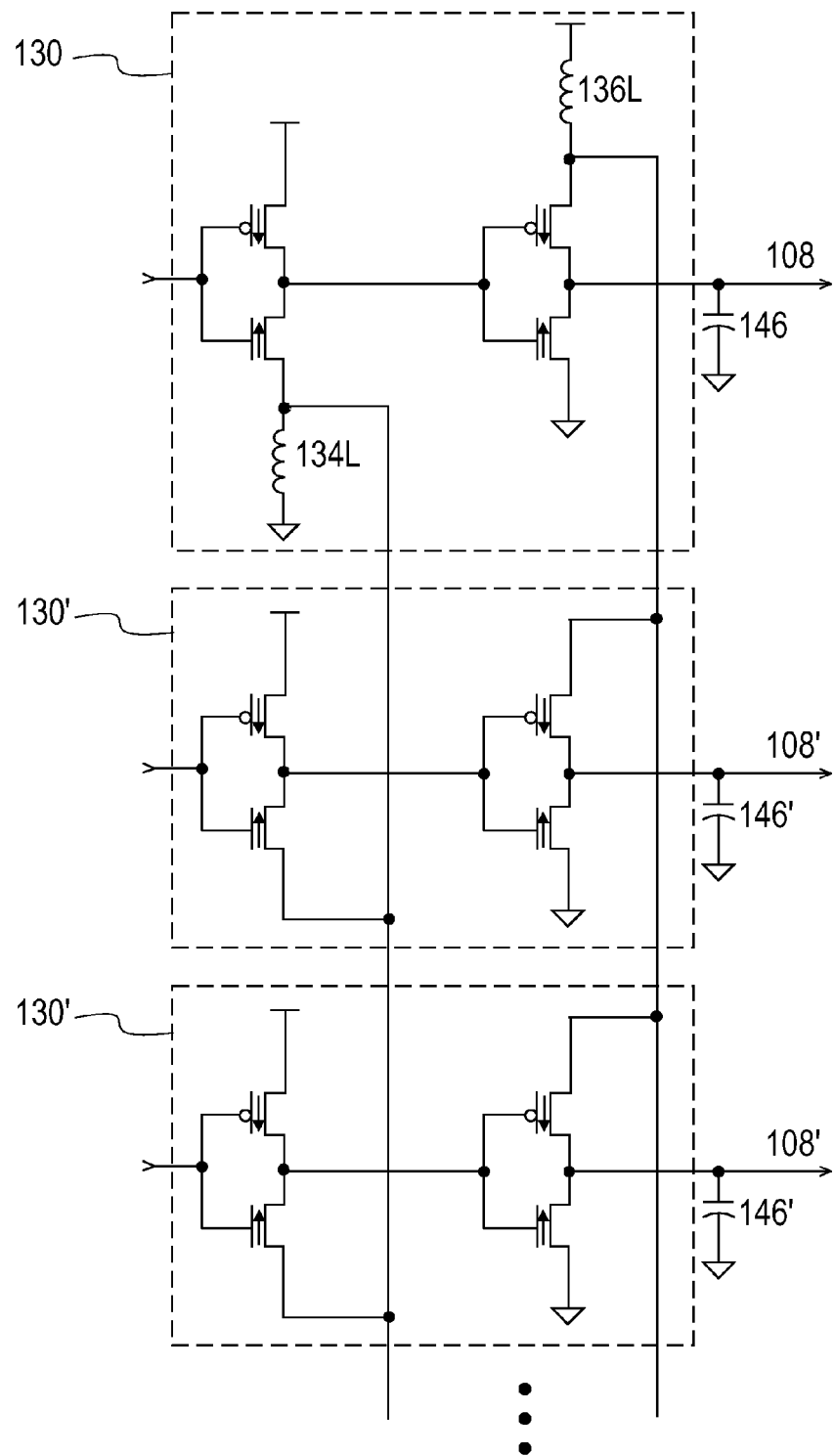
FIG. 5 shows an example of sharing peaking inductors for more efficient inductor use and reduced inductor area.

FIG. 5 shows an example of sharing peaking inductors 134L, 136L for more efficient inductor use and reduced inductor area. In this example, N preferred launch clock drivers 130, 130' share peaking inductors 134L, 136L in launch clock driver 130, increasing the charging current through the inductor 134L due to the additional (2 in this example) loads 146', and enhancing the peaking effect. This results in a lower effective R through which the load C is charged for enhanced peaking effect. The enhanced peaking further allows reducing the size of the peaking inductors 134L, 136L, and/or further reducing the width charging devices 134N, 136P to maintain the desired edge rate.

Figure 6:
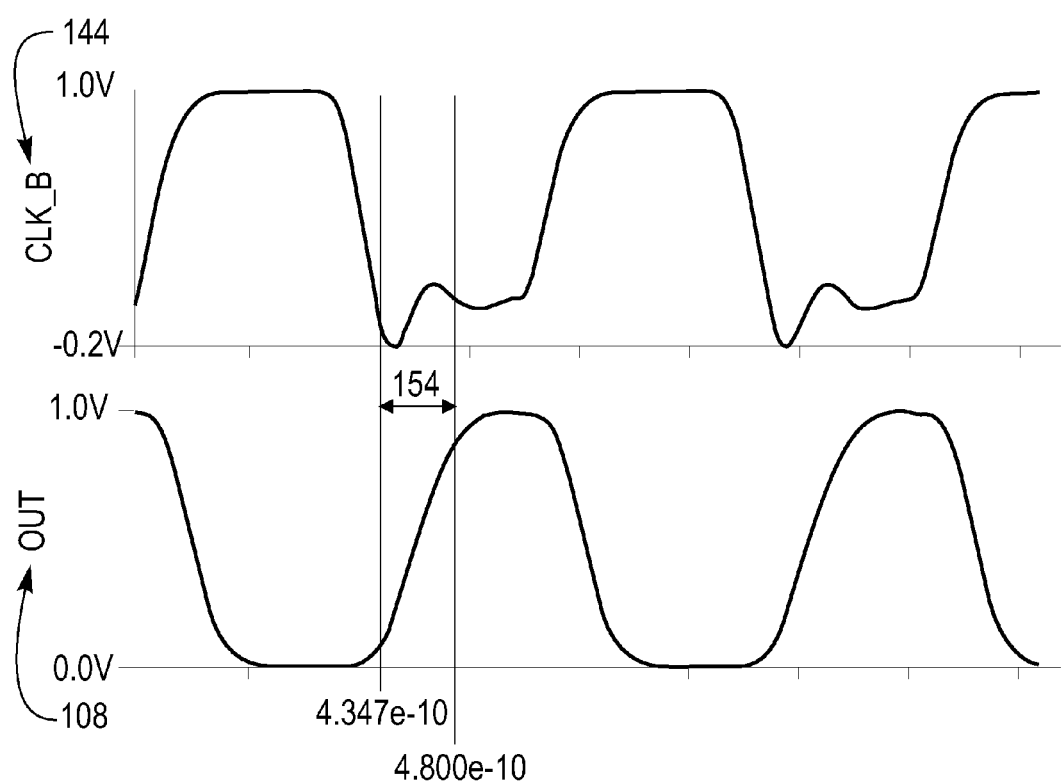
FIG. 6 shows a timing example of the launch clocks generated by preferred launch clock drivers with inductances shared by 4 LCBs.

FIG. 6 shows a timing example of the launch clocks 108, 108' generated by preferred launch clock drivers 130, 130' of FIG. 5 with shared inductances 134L, 136L, shared by 4 LCBs 102. So, in this example, inductances is reduced to 400 pH, while the rise time 154, is maintained at 45 ps.

Advantageously, a chip clocked with asymmetric inductive peaking buffers according to a preferred embodiment of the present invention maintains edge rate precision with reduced power. Further, by sharing of peaking inductors across several LCBs, area dedicated for on-chip inductors is substantially reduced over prior art inductive peaking circuits. The shared inductors encounter a lower effective device resistance for charging or discharging load capacitances to further enhance peaking effects. Moreover, because peaking is enhanced, the inductors may be further reduced while maintaining performance, or instead, charging device widths may be further reduced for even lower power, while maintaining a desired critical edge rate or sharpness.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A Local Clock Buffer (LCB) for clocking an Integrated Circuit (IC) chip, said LCB comprising:
    a plurality of series connected logic gates, a global clock being provided to one of said plurality of series connected logic gates, and at least one other of said plurality of series connected logic gates providing a local clock;
    a single peaking inductor in each of said plurality of series connected logic gates, said single inductor being located between gate devices and a supply line in alternating ones of said plurality of series connected logic gates and between said gate devices and a supply return in remaining ones; wherein each said local clock has an identified critical edge, said single peaking inductors being located to sharpen said critical edge; and wherein each said single peaking inductor is shared with other corresponding logic gates in a plurality of other LCBs.

2. A LCB as in claim 1, wherein said IC chip is a CMOS IC chip.

3. A Local Clock Buffer (LCB) for clocking a CMOS Integrated Circuit (IC) chip, said LCB comprising:
    a plurality of series connected logic gates, a global clock being provided to one of said plurality of series connected logic gates, and at least one other of said plurality of series connected logic gates providing a local clock, said local clock having an identified critical edge, wherein said local clock is a launch clock, said identified critical edge is a rising edge and said plurality of series connected logic gates comprises:
        a first inverter receiving said global clock, and
        a second inverter driven by said first inverter and driving said local clock; and
    a single peaking inductor in each of said plurality of series connected logic gates, said single peaking inductor being located to sharpen said critical edge between gate devices and a supply line in alternating ones of said plurality of series connected logic gates and between said gate devices and a supply return in remaining ones.

4. A LCB as in claim 3, wherein said first inverter includes one said inductor between an N-type Field Effect Transistor (NFET) and ground and said second inverter includes another said inductor between a P-type FET (NFET) and said supply.

* * * * *